(12) United States Patent
Chen et al.

(10) Patent No.: US 8,395,200 B2
(45) Date of Patent: Mar. 12, 2013

(54) METHOD AND SYSTEM FOR MANUFACTURING COPPER-BASED CAPACITOR

(75) Inventors: Zhen Chen, Shanghai (CN); Yung Feng Lin, Shanghai (CN); Lin Huang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/950,973

(22) Filed: Nov. 19, 2010
(Under 37 CFR 1.47)

(65) Prior Publication Data
US 2012/0112315 A1    May 10, 2012

(30) Foreign Application Priority Data
Nov. 20, 2009    (CN) .......................... 2009 1 0199228

(51) Int. Cl.
*H01L 27/108* (2006.01)
*H01L 29/94* (2006.01)
*H01L 21/20* (2006.01)

(52) U.S. Cl. ......... 257/306; 257/E27.048; 257/E21.351; 438/381; 438/687

(58) Field of Classification Search .................. 257/306; 438/381, 687
See application file for complete search history.

(56) References Cited

U.S. PATENT DOCUMENTS

| | | | |
|---|---|---|---|
| 6,320,244 B1 | 11/2001 | Alers et al. | |
| 6,329,234 B1 | 12/2001 | Ma et al. | |
| 6,346,454 B1 | 2/2002 | Sung et al. | |
| 6,384,442 B1 | 5/2002 | Chen | |
| 6,387,775 B1 | 5/2002 | Jang et al. | |
| 6,759,703 B1 * | 7/2004 | Matsuhashi | 257/306 |
| 7,745,280 B2 * | 6/2010 | Chiang | 438/239 |

FOREIGN PATENT DOCUMENTS

| | | |
|---|---|---|
| CN | 1627477 A | 6/2005 |
| KR | 10-2004-0022950 A | 3/2004 |

* cited by examiner

*Primary Examiner* — William D Coleman
(74) *Attorney, Agent, or Firm* — Kilpatrick Townsend & Stockton LLP

(57) ABSTRACT

A method for manufacturing a capacitor on an integrated circuit includes providing an inter-metal dielectric layer on a substrate, a bottom layer having a first and second portions, a first insulating layer having via plug openings on the bottom layer, and via plugs disposed in the via plug openings. The via plugs include a first and second via plugs and are electrically coupled to the first portion of the bottom layer. The method further includes providing a capacitor layer having a first barrier metal layer coupled to the first via plug. The capacitor layer also has a capacitor dielectric layer overlying the first barrier metal layer and a second barrier metal overlying the capacitor dielectric layer. The method further includes defining a first and second capacitor layer portions. The first capacitor layer portion has two opposite sides and spacers disposed on their surface.

21 Claims, 7 Drawing Sheets

METHOD AND SYSTEM FOR MANUFACTURING COPPER-BASED CAPACITOR

CROSS-REFERENCES TO RELATED APPLICATIONS

This application claims priority to Chinese Patent Application No. 200910100228.7, filed Nov. 11, 2009, entitled "Integrated Circuit Including MIM Capacitor and Method of Fabrication," by inventors Zhen Chen, et. al., commonly assigned, incorporated by reference herein for all purposes.

BACKGROUND OF THE INVENTION

The present invention is directed to integrated circuits. More particularly, embodiments of the invention provide high quality copper based capacitor that can be manufactured at low costs. Merely by way of example, embodiments of the invention have been applied to the fabrication of capacitors on integrated circuits characterized by a channel length of less than 130 nanometers. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

One of the challenges in manufacturing IC has been to produce high quality capacitor within integrated circuits. As an essential element for many integrated circuits, capacitors and the manufacturing process thereof have been a challenge for fabrication laboratories. The capability and reliability of capacitors in the past have been related to physical dimensions. As the size of integrated circuits becomes smaller, the manufacturing of capacitors becomes increasingly difficult.

In the past, various conventional techniques have been developed for fabricating capacitors. For example, metal-insulator-metal (MIM) type capacitors have been fabricated for various applications using conventional techniques. Unfortunately, these techniques have been inadequate.

Therefore, it is desirable to have an improved technique for manufacturing capacitors for integrated circuits.

BRIEF SUMMARY OF THE INVENTION

The present invention is directed to integrated circuits. More particularly, embodiments of the invention provide high quality copper based capacitor that can be manufactured at low costs. Merely by way of example, embodiments of the invention have been applied to the fabrication of capacitors on integrated circuits characterized by a channel length of less than 130 nanometers. But it would be recognized that embodiments of the invention have a much broader range of applicability.

According to an embodiment of the present invention, a method for manufacturing a capacitor on an integrated circuit is provided. For example, the integrated circuit is associated with a channel length of less than 0.13 um. It is to be appreciated that, depending upon application, embodiments of the present invention provide an improved method for manufacturing capacitors and thus allow MIM capacitors to be manufactured at smaller dimensions.

The method includes a step for providing a substrate. The method also includes a step for providing a layer of inter-metal dielectric overlaying the substrate. The method additionally includes a step for providing a bottom layer. The bottom layer includes a first portion and a second portion. The first portion can be characterized as electrically conductive. For example, the first portion is consisted of copper material. In addition, the method includes a step for providing a first insulating layer overlaying the bottom layer. The first insulating layer includes one or more via plug openings positioned above the first portion. Furthermore, the method includes a step for providing a first plurality of via plugs positioned within the one or more via plug openings. The first plurality of via plugs includes a first via plug and a second via plug. The first plurality of via plugs is electrically coupled to the first portion of the bottom layer. In addition, the method includes a step for providing a capacitor layer. The capacitor layer includes a first barrier metal. The first barrier metal is electrically coupled to the first plurality of via plugs. The capacitor layer further includes a capacitor dielectric layer overlying the first barrier metal. The capacitor layer further includes a second barrier metal overlying the capacitor dielectric layer. Additionally, the method includes a step for defining a first capacitor layer portion and a second capacitor layer portion. The first capacitor layer portion is above the first via plug. The first capacitor layer portion includes a first side and a second side. The second capacitor layer portion is above the second via plug. The method also includes a step for removing a portion of the second capacitor layer portion. The method additionally includes a step for providing a first spacer positioned against the first side. The method includes a step for providing a second spacer positioned against the second side. In addition, the method includes a step for providing a first electrical connection. The electrical connection is coupled to the first via plug. The method also includes a step for providing a second electrical connection. The second electrical connection is coupled to the second via plug.

According to another embodiment, a partially processed integrated circuit can be characterized by a channel length of, for example, less than 0.13 um. For example, the partially processed integrated circuit is used to fabricate MIM capacitors. The partially processed integrated circuit includes a substrate material. For example, the substrate material is pure silicon. The partially processed integrated circuit also includes a inter-metal dielectric layer overlaying the substrate material. In addition, the partially processed integrated circuit includes a bottom layer. The bottom layer includes a first portion and a second portion. The first portion can be characterized as electrically conductive. Depending upon application the first portion includes metals such as copper. The partially processed integrated circuit additionally includes a first insulating layer overlaying the bottom layer. The first insulating layer includes one or more via plug openings positioned above the first portion. Furthermore, the partially processed integrated circuit includes a first plurality of via plugs positioned within the one or more via plug openings. The first plurality of via plugs includes a first via plug and a second via plug. The first plurality of via plugs is electrically coupled to the first portion of the bottom layer.

According to another embodiment of the present invention, a method for manufacturing a capacitor for an integrated circuit includes providing a bottom copper layer and providing a capacitor layer overlying the bottom copper layer. The capacitor layer includes a first barrier metal, a capacitor dielectric layer overlying the first barrier metal, and a second barrier metal overlying the capacitor dielectric layer. The method includes selectively removing a portion of the second barrier metal, whereby the area of the remaining second barrier metal defines the area of the capacitor. The method also includes forming a top copper layer overlying the second barrier layer. In a specific embodiment, the method further includes forming a plurality of contact plugs over the second barrier before forming the top copper layer.

According to yet another embodiment of the present invention, capacitor for an integrated circuit includes a bottom copper layer. The capacitor also has a capacitor layer that includes a dielectric layer sandwiched between a first barrier layer and a second barrier layer. The capacitor layer also includes a top copper layer overlying the capacitor layer. In an embodiment, the capacitor also includes a plurality of conductive plugs disposed between and in contact with the first barrier layer and the bottom copper layer. In an alternative embodiment, the capacitor also includes a plurality of conductive plugs disposed between and in contact with the second barrier layer and the top copper layer. In still another embodiment, the invention provides an integrated circuit that includes the capacitor described above. In some embodiments, an integrated circuit may include one or more capacitors discussed above.

In some embodiments, the capacitor described above also includes spacers adjacent to sidewalls of the capacitor layer. In some embodiment, the capacitor also includes a hard mask layer overlying the second barrier layer. In certain embodiments, the capacitor also has spacers adjacent to sidewalls of a structure including the hard mask and the capacitor layer. In some embodiments, the hard mask comprises a dielectric material having etching selectivity with respect to the first and the second barrier layers. In some other embodiments, the hard mask includes a metal-containing material having etching selectivity with respect to the first and the second barrier layers.

It is to be appreciated that an MIM capacitor can be manufactured according to an embodiment of the present invention using only one photo layer, as compared to the conventional techniques that requires three photo layers during the manufacturing process. It is to be appreciated that the reduced number of layers used during the manufacturing process highly reduces the manufacturing costs. Depending upon application, the present invention also simplifies the manufacturing process of MIM capacitors and consequentially improves capacitor uniformity and reliability. There are other benefits as well.

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention is directed to integrated circuits. More particularly, embodiments of the invention provide high quality copper based capacitor that can be manufactured at low costs. Merely by way of example, embodiments of the invention have been applied to the fabrication of capacitors on integrated circuits characterized by a channel length of less than 130 nanometers. But it would be recognized that embodiments of the invention have a much broader range of applicability.

As discussed above, various conventional techniques have been developed for fabricating capacitors. However, these techniques have been inadequate. For example, some techniques allow high-quality capacitors to be produced, but usually at very high costs. Moreover, the conventional method for fabricating MIM capacitors using current copper technology has various reliability problems. For example, if the upper surface of lower Cu electrode is adjacent directly to capacitor dielectric without any barrier metal, the dielectric can only be selected from a very limited group and will still risk in reliability issue. On the other hand, if barrier metal on lower Cu electrode is involved, three additional photo layers may be needed, (as compared to logic baseline process). Typically, the additional photo layers introduce a large amount of added costs.

FIGS. 1a-5 are simplified diagrams illustrating a conventional process of fabricating a copper based MIM capacitor. These diagrams merely provide an example, which should not unduly limit the scope of the claims. One of ordinary skill in the art would recognize many variations, alternatives, and modifications.

Figure 1A:
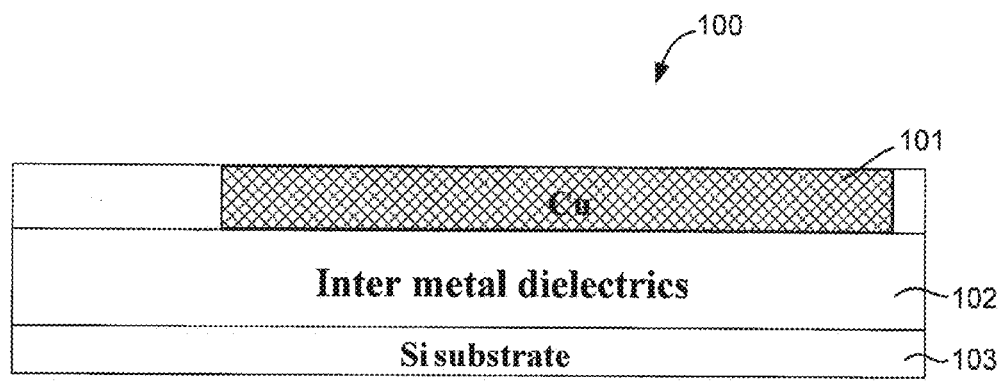
FIGS. 1a-5 are simplified diagrams illustrating a conventional process of fabricating copper-based MIM capacitor.

In a conventional process of fabricating copper based MIM capacitor, a partially processed integrated circuit 100 as illustrated in FIG. 1a is typically used. As FIG. 1a illustrates, the partially integrated circuit 100 includes a substrate 103, inter metal dielectrics (IMD) layer 102, and copper layer 101. The copper layer 101 is used to provide electrical interconnect. Typically, the copper layer 101 is provided using a chemical mechanical polishing (CMP) process.

Figure 1B:
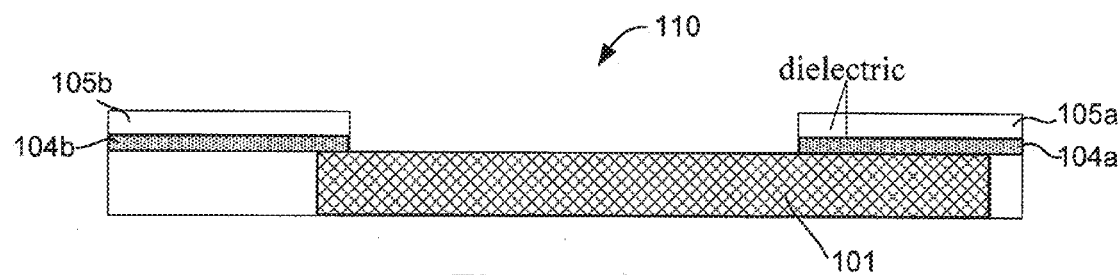

The partially processed integrated circuit 100 is then processed into a partially processed integrated circuit 110 in FIG. 1b. For example, the process involved includes depositing dielectric materials and etching. Here, one photo layer is typically used. The partially processed integrated circuit 110 includes the copper layer 101, dielectric layers 104a, 104b, 105a, and 105b. Note that the layers below copper layer 101 shown in FIG. 1a are omitted for clarity. For example, the dielectric layers 104a and 104b includes silicon nitride material, and the dielectric layers 105a and 105b includes undoped silicate glass material and/or flurosilicate glass material.

Figure 2:
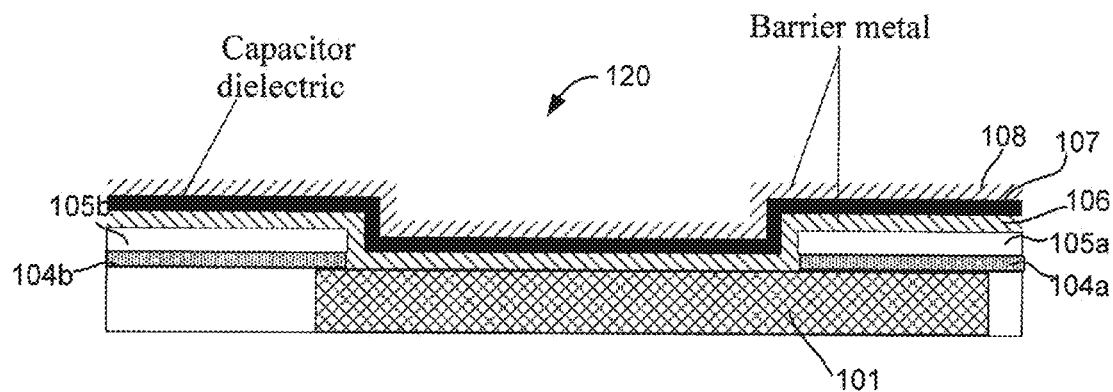

The partially processed integrated circuit 110 is then processed into a partially processed integrated circuit 120 in FIG. 2. Two layers of barrier metals are deposited. A layer of capacitor dielectric is deposited between the two layers of barrier metals. The partially processed integrated circuit 110 includes the copper layer 101, dielectric layers 104a, 104b, 105a, 105b, barrier metal layers 106 and 108, and capacitor dielectric 107. Various types of materials can be used for barrier metal. For example, materials such as tantalum, tantalum nitride, titanium, titanium nitride, and aluminum can be used as barrier metal.

Figure 3:
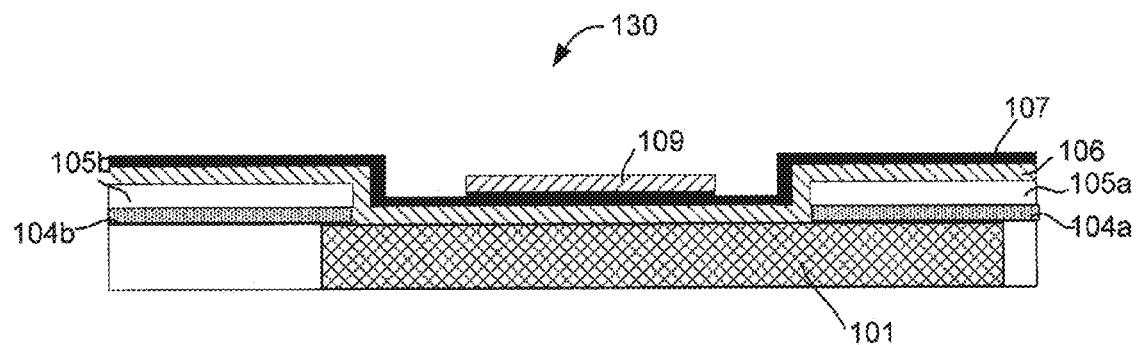

The partially processed integrated circuit 120 is then processed into a partially processed integrated circuit 130 in FIG. 3. Typically, etching process is used to partially remove barrier metal layer 108 and capacitor dielectric 107. To perform etching, one photo layer is typically used. After the etching process is performed, the partially integrated circuit 130 includes the copper layer 101, dielectric layers 104a, 104b, 105a, 105b, barrier metal layers 106 and 109, and capacitor dielectric 107.

Figure 4:
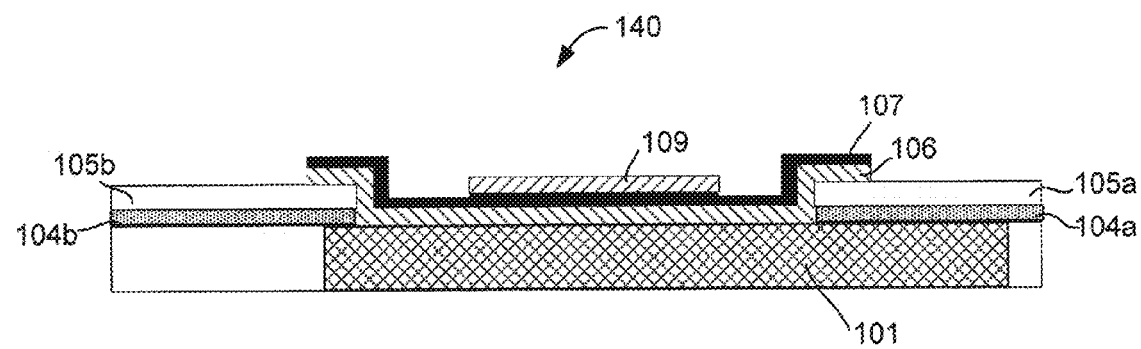

The partially processed integrated circuit 130 is then processed into a partially processed integrated circuit 140 in FIG. 4. For example, an etching process is used to partially remove barrier metal 106 and capacitor dielectric 107. Here, before etching, one photo layer is typically used. After the etching process is performed, the partially integrated circuit 140 includes the copper layer 101, dielectric layers 104a, 104b, 105a, 105b, barrier metal layers 106 and 109, and capacitor dielectric 107.

Figure 5:
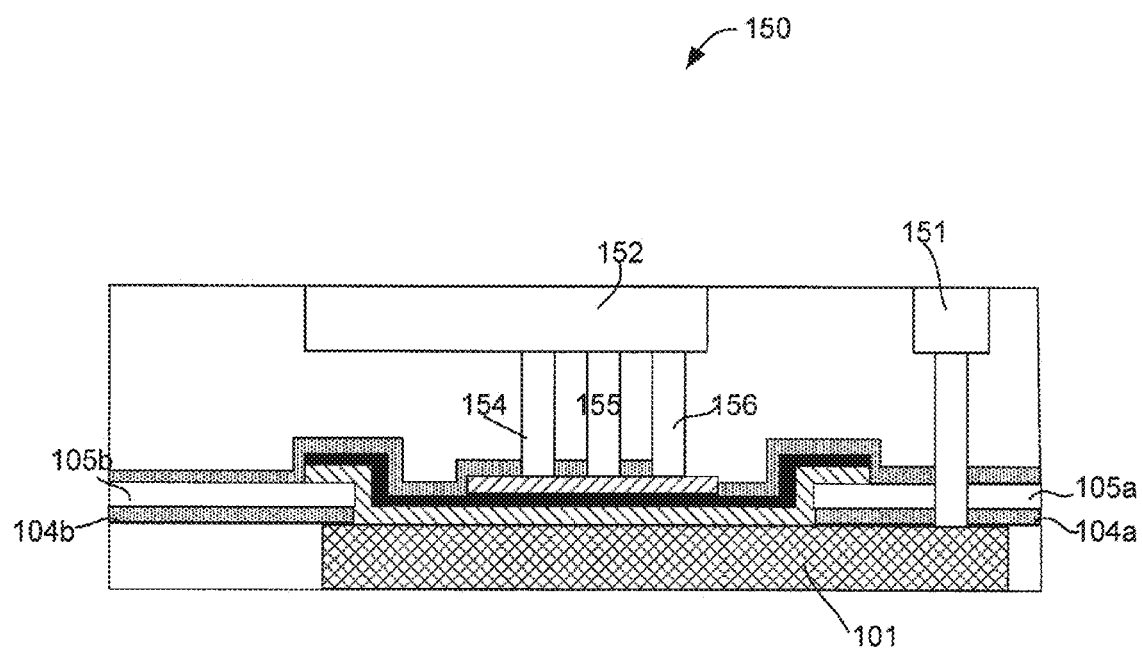

The partially processed integrated circuit 140 is then processed into a partially processed integrated circuit 150 in FIG. 5. For example, dual damascene process is performed to provide via 154, 155, 156, 157, and the top metal layers 152 and 151 as electrical connection.

As another example, single damascene process is performed twice to provide via 154, 155, 156, 157, and the top metal layers 152 and 151 as electrical connection. Typically, the top metal layer and via include copper material.

As demonstrated from FIGS. 1a through 5, three photo layers are needed to manufacture a capacitor according to the conventional technique. Typically, due to the number of steps involved and the level of complexity, the cost for manufacturing for the conventional technique is usually high. Therefore, it is desirable to provide an improved technique for manufacturing MIM capacitors.

FIGS. 6 through 11 are simplified diagrams illustrating a technique for manufacturing an MIM capacitor according to an embodiment of the present invention. These diagrams merely provide an example, which should not unduly limit the scope of the claims. One of ordinary skill in the art would recognize many variations, alternatives, and modifications.

Figure 6A:
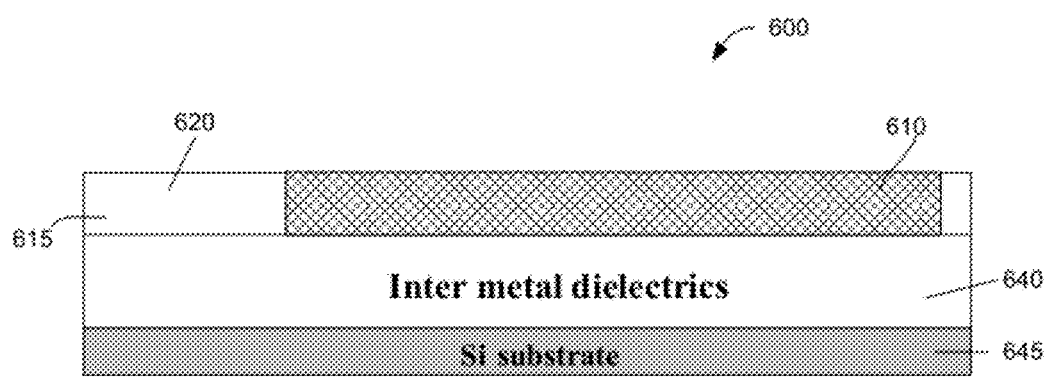
FIGS. 6a through 11 are simplified diagrams illustrating a technique for manufacturing an MIM capacitor according to an embodiment of the present invention.

Typically, a partially process integrated circuited 600 as shown in FIG. 6a is provided. The partially integrated circuit 600 includes a substrate 645, an IMD layer 640, and a bottom layer 615. The bottom layer 615 includes a first portion 610 and a second portion 620. The first portion 610 includes electrically conductive material such as copper that can be used to provide electrical connection. For example, the first portion is provided by CMP process. The second portion 620 is used to provide insulation. Depending upon applications, the second portion 620 can be undoped silicate glass, fluorosilicate glass, or other material.

Figure 6B:
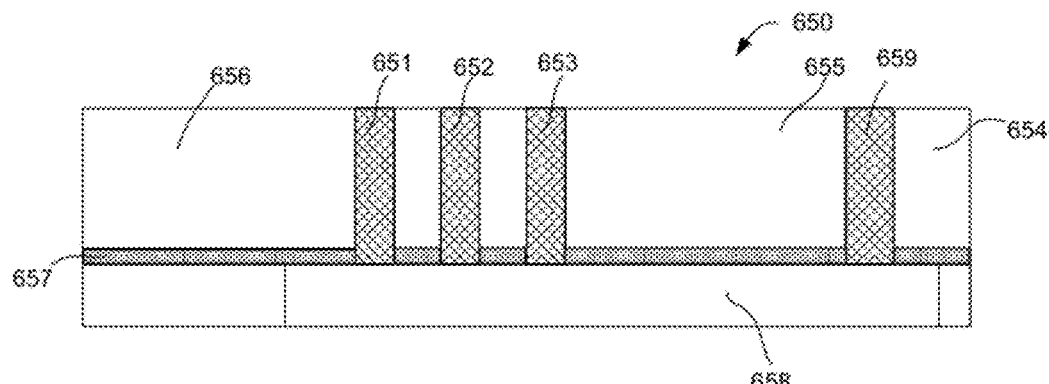

Next, the partially processed integrated circuit 600 is processed into a partially processed integrated circuit 650, as shown in FIG. 6b, to include one or more vias. According to an embodiment, a single damascene process is used to provide via openings. Via plugs 651, 652, 653, and 659 are formed and positioned within the via openings, connecting to the first portion 658 of the bottom layer. The via plugs are used to provide electrical connection. Depending upon application, via plugs are insulated from one another by insulating materials 654, 655, and 656. In FIG. 6b, copper layer 658 corresponds to portion 610 in FIG. 6a, which can be a copper layer. The layers below layer 610 in FIG. 6a are omitted in FIG. 6b and subsequent figures.

Figure 7:
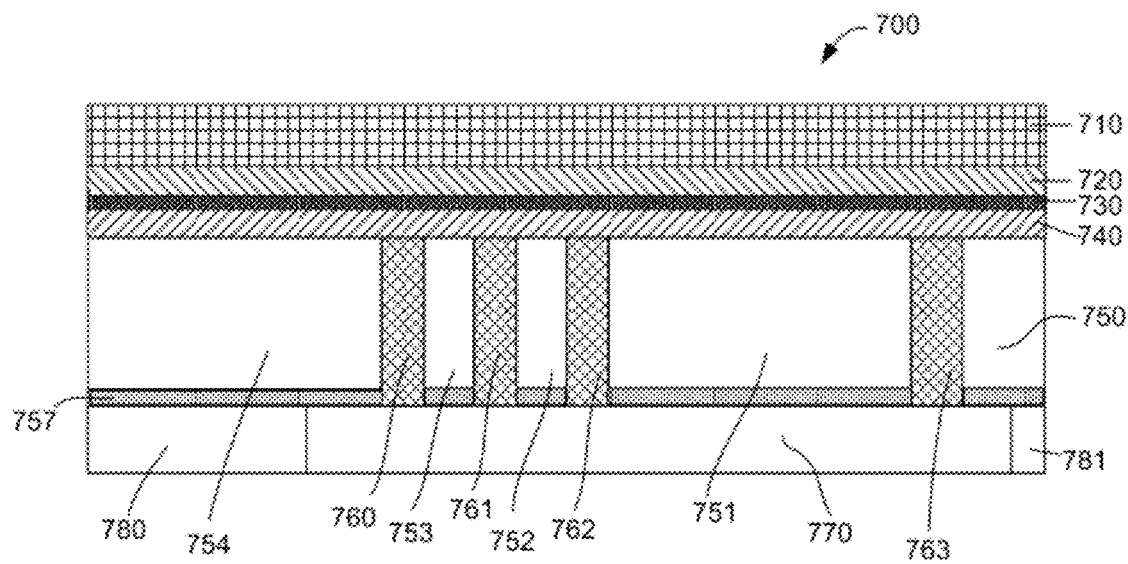

Next, various layers of materials are deposited upon the partially processed integrated circuit 650 to form a partially processed integrated circuit 700 as shown in FIG. 7. First, a barrier metal layer 740 is deposited upon the partially processed integrated circuit 650. Depending upon the applications, materials such as tantalum, tantalum nitride, titanium, titanium nitride, and aluminum can be used as barrier metal. Next, a capacitor dielectric layer 730 is deposited on top of the barrier metal layer 740. According to various embodiments, materials such as silicon nitride may be used as capacitor dielectric. Then, a barrier metal layer 720 is deposited upon the capacitor dielectric layer 730. Next, a hard mask layer 710 is deposited upon the barrier metal layer 720. Typically, the hard mask layer is characterized by good etching selectivity to the barrier metal. The hard mask can be a dielectric material or a metal-containing material.

Figure 8:
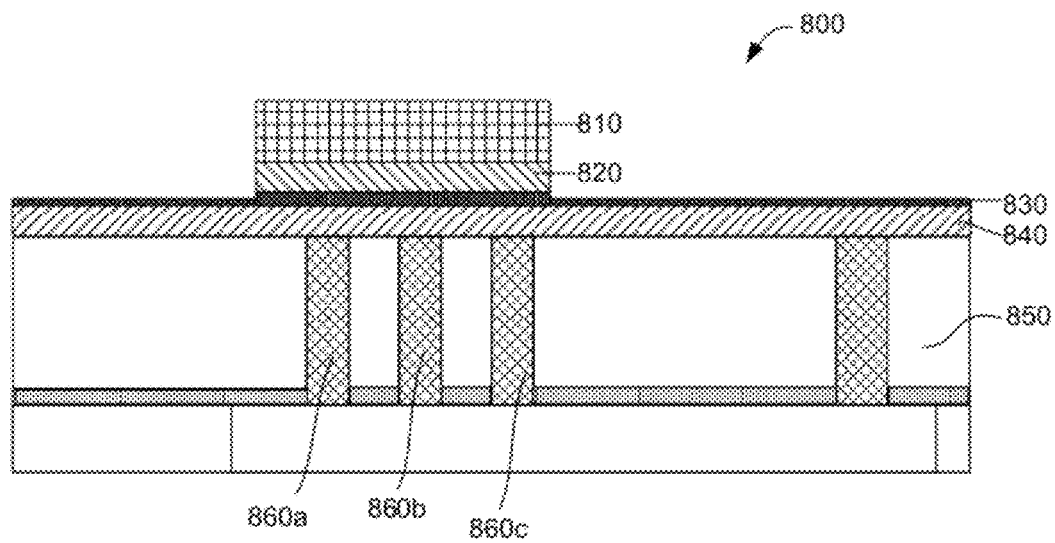

The partially processed integrated circuit 700 is then processed into a partially processed integrated circuit 800 as shown in FIG. 8. According to an embodiment, an etching process is performed. Typically, a photo layer is used during the etching process. Portions of the hard mask 700, the barrier metal layer 720, the capacitor dielectric layer 730 are removed by the etching process. Depending upon application, etching depth varies. For example, the etching process may remove a portion of the barrier metal layer 730. After etching, the partially processed integrated circuit 800 includes, among other things, a hard mask layer 810, a barrier metal layer 820, a capacitor dielectric layer 830, and a barrier metal layer 840 overlaying via plugs 860a, 860b, 860c.

Figure 9:
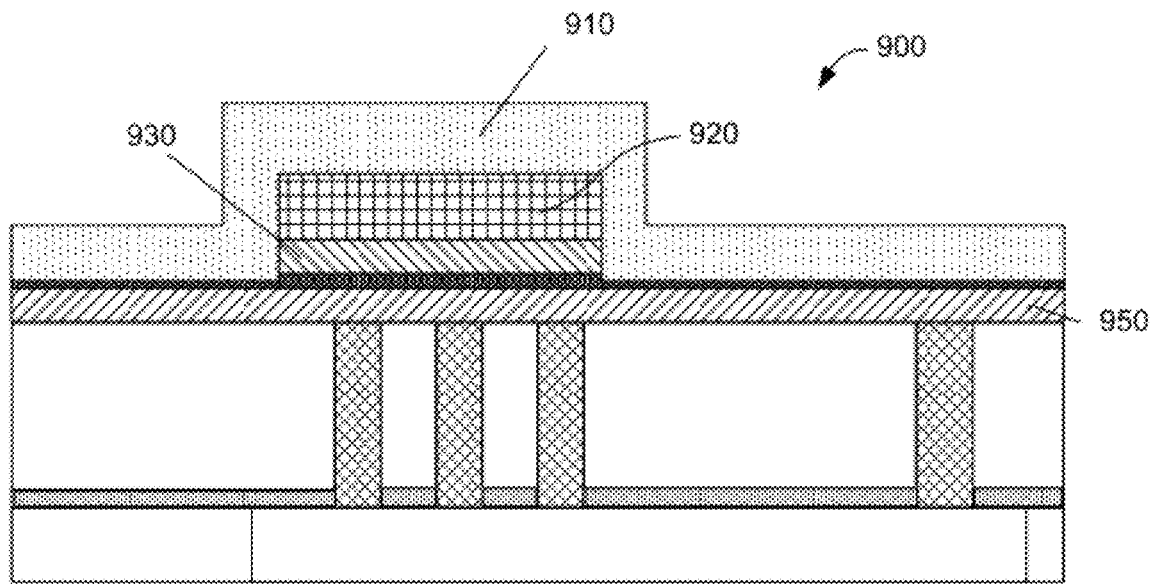

The partially processed integrated circuit 800 is then processed into a partially processed integrated circuit 900 as shown in FIG. 9. As shown, a dielectric layer 910 is deposited over the partially processed integrated circuit 800. The dielectric layer 910 is to be used as spacer material.

Figure 10:
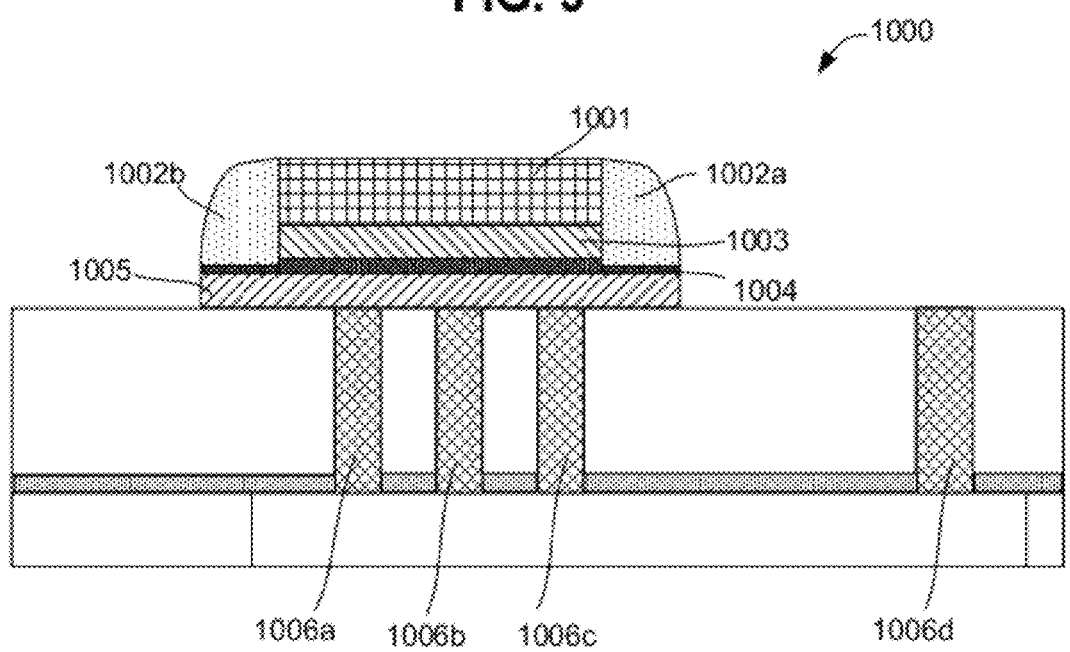

The partially processed integrated circuit 900 is then processed into a partially processed integrated circuit 1000 as shown in FIG. 10. As shown, the dielectric layer 910 and the barrier metal layer 950 are partially etched away. Depending upon application, the etching process takes one or more steps. After the etching process, the dielectric layer 910 becomes spacers 1002a and 1002b. The spacers 1002a and 1002b are used to separate the barrier metal layer 1003 and the barrier metal layer 1005. As an example, the widths of spacers are controlled by the thickness of the hard mask 1001 and the etching process. After the etching process, via plugs 1006a, 1006b, and 1006c are beneath the capacitor formed by the barrier metal layers 1003 and 1005 and the capacitor dielectric layer 1004. Via plug 1006d is not beneath any capacitors.

Figure 11:
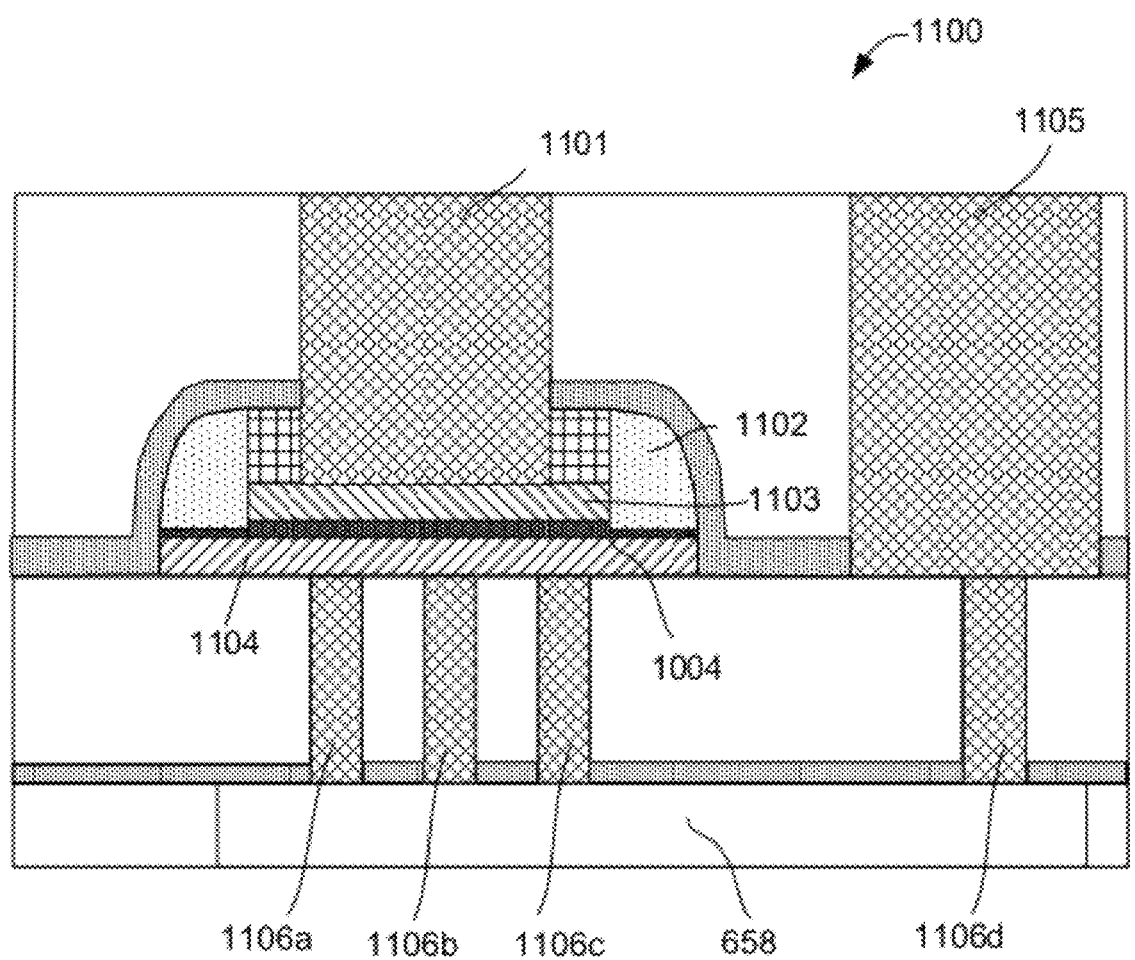

The partially processed integrated circuit 1000 is then processed into a partially processed integrated circuit 1100 as shown in FIG. 11. According to an embodiment, a single damascene process is performed to produce electrical connections. Typically, electrical connections can include a metal material. An electrical connection 1101, for example, a conductive material, is coupled to the barrier metal layer 1103, which is a part of the capacitor formed by barrier metal layers 1103 and 1104 and the capacitor dielectric layer 1104. An electrical connection 1105, e.g., a conductive material, is connected to via plug 1106d.

The partially processed integrated circuit 1100 as shown in FIG. 11 includes an MIM capacitor. The capacitor includes the barrier metal layer 1103, which is connected to the electrical connection 1101. The capacitor also includes the barrier metal layer 1104, which is connected to the electrical connection 1105 through bottom conductor 658. Between the two barrier metal layers is the capacitor dielectric layer 1004. In an exemplary operation, the difference in voltage potential between the two barrier metal layers causes electrical charge to be deposited on either side of the capacitor dielectric material.

As illustrated according to FIG. 6a-11, an MIM capacitor can be manufactured according to an embodiment of the present invention using only one photo layer, as compared to the conventional techniques that requires three photo layers during the manufacturing process. It is to be appreciated that the reduced number of layers used during the manufacturing process highly reduces the manufacturing costs. Depending upon application, the present invention also simplifies the manufacturing process of MIM capacitors and consequentially improves capacitor uniformity and reliability. There are other benefits as well.

An embodiment of the present invention provides a method for manufacturing a capacitor on an integrated circuit. For example, the integrated circuit is associated with a channel length of less than 0.13 um. It is to be appreciated that, depending upon application, embodiments of the present invention provides a more improved method for manufacturing capacitors and thus allow MIM capacitors to be manufactured at smaller dimensions.

The method includes a step for providing a substrate. The method also includes a step for providing a layer of inter-metal dielectric overlaying the substrate. The method additionally includes a step for providing a bottom layer. The bottom layer includes a first portion and a second portion. The first portion can be characterized as electrically conductive. For example, the first portion consists-of copper. In addition, the method includes a step for providing a first insulating layer overlaying the bottom layer. The first insulating layer includes one or more via plug openings over the first portion. Furthermore, the method includes a step for forming a first plurality of via plugs within the one or more via plug openings. The first plurality of via plugs may include a first via plug and a second via plug. The first plurality of via plugs is electrically coupled to the first portion of the bottom layer. In addition, the method includes a step for providing a capacitor layer. The capacitor layer includes a first barrier metal. The first barrier metal is electrically coupled to the first plurality of via plugs. The capacitor layer further includes a capacitor dielectric layer overlying the first barrier metal. The capacitor layer further includes a second barrier metal overlying the capacitor dielectric layer. Additionally, the method includes a step for defining a first capacitor layer portion and a second capacitor layer portion. The first capacitor layer portion is above the first via plug. The first capacitor layer portion includes a first side and a second side. The second capacitor layer portion is above the second via plug. The method also includes a step for removing a portion of the second capacitor layer portion. The method additionally includes a step for providing a first spacer disposed on the first side and a second spacer disposed on the second side. In addition, the method includes a step for providing a first electrical connection. The electrical connection is coupled to the first via plug. The method also includes a step for providing a second electrical connection. The second electrical connection is coupled to the second via plug. As an example, the method can be illustrated according to FIGS. 6a to 11.

According to another embodiment, present invention provides a partially processed integrated circuit characterized by a channel length of less than 0.13 um comprising. For example, the partially processed integrated circuit is used to fabricate MIM capacitors. The partially processed integrated circuit includes a substrate material. For example, the substrate material is pure silicon. The partially processed integrated circuit also includes a inter-metal dielectric layer overlaying the substrate material. In addition, the partially processed integrated circuit includes a bottom layer. The bottom layer includes a first portion and a second portion. The first portion can be characterized as electrically conductive. Depending upon application the first portion includes metals such as copper. The partially processed integrated circuit additionally includes a first insulating layer overlaying the bottom layer. The first insulating layer includes one or more via plug openings positioned above the first portion. Furthermore, the partially processed integrated circuit includes a first plurality of via plugs positioned within the one or more via plug openings. The first plurality of via plugs includes a first via plug and a second via plug. The first plurality of via plugs is electrically coupled to the first portion of the bottom layer. As an example, the partially processed integrated circuit can be illustrated according to FIG. 6b.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing a capacitor on an integrated circuit, the integrated circuit being associated with a channel length of less than 0.13 um, the method comprising:
   providing a substrate;
   providing a layer of inter metal dielectric overlaying the substrate;
   providing a bottom layer including a first portion and a second portion, the first portion being characterized as electrically conductive;
   providing a first insulating layer overlaying the bottom layer, the first insulating layer including one or more via plug openings positioned above the first portion;
   providing a first plurality of via plugs disposed within the one or more via plug openings, the first plurality of via plugs includes a first via plug and a second via plug, the first plurality of via plugs being electrically coupled to the first portion of the bottom layer;
   providing a capacitor layer including a first barrier metal electrically coupled to the first via plug, the capacitor layer further including a capacitor dielectric layer overlying the first barrier metal and a second barrier metal overlying the capacitor dielectric layer;
   defining a first capacitor layer portion and a second capacitor layer portion, the first capacitor layer portion being above the first via plug, the first capacitor layer portion including a first side and a second side, the second capacitor layer portion being above the second via plug;
   removing a portion of the second capacitor layer portion;
   providing a first spacer positioned against the first side;
   providing a second spacer positioned against the second side;
   providing a first electrical connection coupled to the first via plug; and
   providing a second electrical connection coupled to the second via plug.

2. The method of claim 1 wherein the first barrier metal includes an aluminum material, a tantalum material, a tantalum nitride material, a titanium material, or a titanium nitride material.

3. The method of claim 1 wherein the second portion includes undoped silicate glass material or fluorosilicate glass material.

4. The method of claim 1 wherein the first portion includes a copper material.

5. The method of claim 1 wherein the first plurality of via plugs includes copper material.

6. The method of claim 1 wherein the capacitor dielectric layer includes silicon nitride material.

7. The method of claim 1 wherein the removing a portion of the second capacitor layer portion comprises:
depositing a hard mask layer, the hard mask layer being associated with the first capacitor layer portion and the second capacitor layer portion;
etching away the second capacitor layer portion.

8. A method for manufacturing a capacitor for an integrated circuit, the method comprising:
providing a bottom copper layer;
providing an insulating layer overlying the bottom copper layer, the insulating layer having a plurality of via openings over the bottom copper layer;
providing a capacitor layer overlying the insulating layer, the capacitor layer including a first barrier metal layer, a capacitor dielectric layer overlying the first barrier metal layer, and a second barrier metal layer overlying the capacitor dielectric layer;
selectively removing a portion of the second barrier metal layer, whereby the area of the remaining second barrier metal layer defines the area of the capacitor;
forming a top copper layer overlying the second barrier metal layer; and
forming spacers on sidewalls of the capacitor layer.

9. The method of claim 8 further comprising forming a contact plug within each of the plurality of plug openings, wherein the contact plug couples the bottom copper layer with the first barrier metal layer.

10. The method of claim 8 further comprising forming a plurality of contact plugs over the second barrier metal layer before forming the top copper layer.

11. The method of claim 8 further comprising:
forming a hard mask layer overlying the second barrier metal layer, the hard mask layer having side surfaces that are covered by the spacers.

12. The method of claim 11 wherein the hard mask layer comprises a dielectric material having good etching selectivity with respect to the first and the second barrier metal layers.

13. The method of claim 11 wherein the hard mask layer comprises a metal containing material having good etching selectivity with respect to the first and the second barrier metal layers.

14. A capacitor for an integrated circuit, the capacitor comprises:
a bottom copper layer;
an insulating layer overlying the bottom copper layer, the insulating layer including a plurality of via openings;
a capacitor layer overlying the insulating layer, the capacitor layer including a dielectric layer sandwiched between a first barrier layer and a second barrier layer;
spacers on sidewalls of the capacitor layer; and
a top copper layer overlying the capacitor layer.

15. The capacitor of claim 14 further comprising a hard mask layer overlying the second barrier layer.

16. The capacitor of claim 14 further comprising a conductive plug within each of the plurality of via openings, the conductive plug being in contact with the first barrier layer and the bottom copper layer.

17. The capacitor of claim 14 further comprising a plurality of conductive plugs disposed between and in contact with the second barrier layer and the top copper layer.

18. The capacitor of claim 15 the hard mask layer has side surfaces that are covered by the spacers.

19. The capacitor of claim 18 wherein the hard mask layer comprises a dielectric material having good etching selectivity with respect to the first and the second barrier layers.

20. The capacitor of claim 18 wherein the hard mask layer comprises a metal containing material having good etching selectivity with respect to the first and the second barrier layers.

21. An integrated circuit comprising a capacitor, the capacitor comprising:
a bottom copper layer;
an insulating layer overlying the bottom copper layer, the insulating layer including a plurality of via openings;
a capacitor layer overlying the insulating layer, the capacitor layer including a dielectric layer sandwiched between a first barrier layer and a second barrier layer;
spacers on sidewalls of the capacitor layer; and
a top copper layer overlying the capacitor layer.

* * * * *